(12) United States Patent
Seo (10) Patent No.: US 12,370,922 B2
(45) Date of Patent: *Jul. 29, 2025

(54) BATTERY MANAGEMENT APPARATUS, BATTERY MANAGEMENT METHOD, BATTERY PACK, AND ELECTRIC VEHICLE

(71) Applicant: LG ENERGY SOLUTION, LTD., Seoul (KR)

(72) Inventor: Bo-Kyung Seo, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/586,325

(22) Filed: Feb. 23, 2024

(65) Prior Publication Data

US 2024/0300378 A1  Sep. 12, 2024

Related U.S. Application Data (63) Continuation of application No. 17/420,867, filed as application No. PCT/KR2020/009889 on Jul. 27, 2020, now Pat. No. 11,912,158.

(30) Foreign Application Priority Data

Sep. 6, 2019 (KR) .......................... 10-2019-0110759

(51) Int. Cl.
 *B60L 58/12* (2019.01)
 *G01R 31/374* (2019.01)
 (Continued)

(52) U.S. Cl.
 CPC ............ *B60L 58/12* (2019.02); *G01R 31/374* (2019.01); *G01R 31/388* (2019.01);
 (Continued)

(58) Field of Classification Search
 CPC ............... B60L 58/12; B60L 2240/545; B60L 2240/547; B60L 2240/549; B60L 3/0046;
 (Continued)

(56) References Cited

U.S. PATENT DOCUMENTS 5,818,202 A  10/1998  Miyamoto et al.
5,926,007 A   7/1999  Okada
(Continued)

FOREIGN PATENT DOCUMENTS

JP   2743155 B2   4/1998
JP   H10-172616 A  6/1998
(Continued)

OTHER PUBLICATIONS

Office Action dated Jun. 28, 2022 issued by the Japanese Patent Office in a corresponding Japanese Patent Application No. 2021-538098.
(Continued)

*Primary Examiner* — Huy Q Phan
*Assistant Examiner* — Haidong Zhang
(74) *Attorney, Agent, or Firm* — BRYAN CAVE LEIGHTON PAISNER LLP (57) ABSTRACT

A battery management apparatus according to the present disclosure includes a memory to store a charging sequence table that records a correspondence relationship between first to $m^{th}$ temperature ranges, first to $m^{th}$ SOC lists and first to $m^{th}$ current lists, a sensing unit to detect a voltage, a current and a temperature of a battery, and a control unit. Each of the SOC lists defines first to $n^{th}$ SOC ranges. The control unit determines a current SOC of the battery based on the detected voltage and the detected current. The control unit determines a temperature range of interest, a SOC list of interest and a current list of interest based on the detected temperature. The control unit determines a remaining charg-
(Continued)

ing time required to charge the battery to a target SOC based on the detected current, the current SOC, the SOC list of interest and the current list of interest.

14 Claims, 5 Drawing Sheets

(51) Int. Cl.
  *G01R 31/388* (2019.01)
  *H01M 10/42* (2006.01)
  *H01M 10/48* (2006.01)
  *H02J 7/00* (2006.01)
(52) U.S. Cl.
  CPC ....... *H01M 10/425* (2013.01); *H01M 10/486* (2013.01); *H02J 7/0048* (2020.01); *B60L 2240/545* (2013.01); *B60Y 2200/91* (2013.01); *H01M 2010/4271* (2013.01); *H02J 7/00712* (2020.01)
(58) Field of Classification Search
  CPC ..... B60L 53/00; G01R 31/374; G01R 31/388; G01R 31/3842; G01R 31/36; G01R 31/387; G01R 31/3648; H01M 10/425; H01M 10/486; H01M 2010/4271; H01M 10/48; H01M 2220/20; H02J 7/0048; H02J 7/00712; B60Y 2200/91; Y02T 10/7072; Y02T 90/14; Y02T 10/70
  See application file for complete search history.

(56) References Cited

U.S. PATENT DOCUMENTS

| | | | | |
|---|---|---|---|---|
| 11,912,158 | B2* | 2/2024 | Seo | G01R 31/388 |
| 2006/0055374 | A1* | 3/2006 | Fujihara | G01R 31/367 |
| | | | | 320/132 |
| 2008/0150489 | A1* | 6/2008 | Shun-Hsing | H01M 10/44 |
| | | | | 320/136 |
| 2009/0273320 | A1* | 11/2009 | Ungar | H01M 10/44 |
| | | | | 320/162 |
| 2012/0105014 | A1 | 5/2012 | Nakayama et al. | |
| 2012/0109443 | A1 | 5/2012 | Takahashi et al. | |
| 2014/0225622 | A1* | 8/2014 | Kudo | B60L 7/14 |
| | | | | 324/433 |
| 2014/0266038 | A1 | 9/2014 | Gibeau et al. | |
| 2014/0361744 | A1 | 12/2014 | Han | |
| 2015/0231985 | A1* | 8/2015 | Li | B60L 58/22 |
| | | | | 320/134 |
| 2015/0249355 | A1 | 9/2015 | Takano et al. | |
| 2015/0318726 | A1 | 11/2015 | Luo et al. | |
| 2018/0079318 | A1 | 3/2018 | Ha et al. | |
| 2018/0145531 | A1 | 5/2018 | Jung et al. | |
| 2018/0272878 | A1 | 9/2018 | Lee | |
| 2019/0123574 | A1 | 4/2019 | Jung et al. | |

FOREIGN PATENT DOCUMENTS

| | | |
|---|---|---|
| JP | 2008-220121 A | 9/2008 |
| JP | 4215013 B2 | 1/2009 |
| JP | 2013-115862 A | 6/2013 |
| JP | 5273794 B2 | 8/2013 |
| JP | 6068100 B2 | 1/2017 |
| KR | 10-2012-0138733 A | 12/2012 |
| KR | 10-2014-0142853 A | 12/2014 |
| KR | 10-2018-0032092 A | 3/2018 |
| KR | 10-2018-0056238 A | 5/2018 |
| KR | 10-2019-0045736 A | 5/2019 |
| KR | 10-2019-0073151 A | 6/2019 |
| WO | 2008/026477 A1 | 3/2008 |
| WO | 2014/046233 A1 | 3/2014 |
| WO | 2019-230131 A1 | 12/2019 |

OTHER PUBLICATIONS

Extended European Search Report dated Mar. 16, 2022 in corresponding European Patent Application No. 20861336.4.
International Search Report issued in corresponding International Patent Application No. PCT/KR2020/009889, dated Oct. 28, 2020.

* cited by examiner

| First temperature range(~-10℃) | #1 | #2 | #3 | #4 | #5 |
|---|---|---|---|---|---|
| First SOC list | ~5% | ~10% | ~15% | ~20% | ~25% |
| First current list | 4A | 3A | 2A | 1A | 0.3A |

| Second temperature range(-10℃~10℃) | #1 | #2 | #3 | #4 | #5 |
|---|---|---|---|---|---|
| Second SOC list | ~10% | ~50% | ~80% | ~90% | ~95% |
| Second current list | 10A | 8A | 5A | 2A | 1A |

| Third temperatur range(10℃~) | #1 | #2 | #3 | #4 | #5 |
|---|---|---|---|---|---|
| Third SOC list | ~50% | ~80% | ~90% | ~95% | ~100% |
| Third current list | 20A | 10A | 5.5A | 2.3A | 1.1A |

BATTERY MANAGEMENT APPARATUS, BATTERY MANAGEMENT METHOD, BATTERY PACK, AND ELECTRIC VEHICLE

This application is a Continuation Application of U.S. patent application Ser. No. 17/420,867, filed on Jul. 6, 2021, now allowed, which is a National Stage of International Application No. PCT/KR2020/009889, filed on Jul. 27, 2020, which claims the benefit Korean Application No. 10-2019-0110759, filed on Sep. 6, 2019, the contents of which are all hereby incorporated by reference herein in their entirety.

TECHNICAL FIELD

The present disclosure relates to technology for estimating the time required to charge a battery.

BACKGROUND ART

Recently, there has been dramatically growing demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

Battery constant current-constant voltage (CC-CV) charging is widely being used. The CC-CV charging is a combined charging technique of CC charging and CV charging, and CC charging is performed until a voltage (or state of charge (SOC)) of a battery reaches a predetermined cut-off voltage (or change-over SOC), and is shifted to CV charging. During CV charging, in response to the drop of the current flowing through the battery down to the threshold, the battery charging may be stopped.

When charging the battery using the CC-CV charging, it is important to estimate the time (referred to as "remaining charging time") required to charge the battery to a target SOC (for example, 95%).

Conventionally, the estimated remaining charging time is calculated by dividing a difference between the current SOC and the target SOC of the battery by the current flowing in the battery. However, the above-described conventional technology is not suitable for so-called multi-stage CC charging using a plurality of charging ranges (for example, the SOC range) defining a plurality of allowable constant currents of different magnitudes. In addition, the conventional technology does not reflect changes of each charging range as the battery degrades in estimating the remaining charging time, resulting in low accuracy in the estimated remaining charging time.

DISCLOSURE

Technical Problem

The present disclosure is designed to solve the above-described problem, and therefore the present disclosure is directed to providing a battery management apparatus, a battery management method, a battery pack and an electric vehicle for accurately estimating the remaining charging time required to charge a battery to a target state of charge (SOC) using a plurality of charging ranges defining allowable constant currents of different magnitudes.

The present disclosure is further directed to providing a battery management apparatus, a battery management method, a battery pack and an electric vehicle for preventing the accuracy of estimation of the remaining charging time from decreasing due to degradation of the battery by correcting the range of each charging range based on a difference between the estimated time required to charge in each charging range and the actual time spent in charging in each charging range.

These and other objects and advantages of the present disclosure may be understood by the following description and will be apparent from the embodiments of the present disclosure. In addition, it will be easily understood that the objects and advantages of the present disclosure may be realized by the means set forth in the appended claims and a combination thereof.

Technical Solution

A battery management apparatus according to an aspect of the present disclosure includes a memory to store a charging sequence table that records a correspondence relationship between first to $m^{th}$ temperature ranges, first to $m^{th}$ state of charge (SOC) lists and first to $m^{th}$ current lists, wherein m is a natural number of 2 or greater, a sensing unit configured to detect a voltage, a current and a temperature of a battery, and a control unit operably coupled to the memory and the sensing unit. Each of the SOC lists defines first to $n^{th}$ SOC ranges. n is a natural number of 2 or greater. Each of the current lists defines first to $n^{th}$ allowable constant currents corresponding to the first to $n^{th}$ SOC ranges in a one-to-one relationship. The control unit determines a current SOC of the battery based on the detected voltage and the detected current. The control unit determines a temperature range of interest, a SOC list of interest and a current list of interest from the charging sequence table based on the detected temperature. The temperature range of interest is a temperature range to which the detected temperature belongs among the first to $m^{th}$ temperature ranges. The SOC list of interest is a SOC list corresponding to the temperature range of interest among the first to $m^{th}$ SOC lists. The current list of interest is a current list corresponding to the temperature range of interest among the first to $m^{th}$ current lists. The control unit is configured to determine a remaining charging time required to charge the battery to a target SOC based on the detected current, the current SOC, the SOC list of interest and the current list of interest.

The control unit may be configured to determine first to $n^{th}$ set capacities corresponding to the first to $n^{th}$ SOC ranges defined by the SOC list of interest in a one-to-one relationship. The control unit may be configured to determine first to $n^{th}$ target capacities for charging the battery in each of the first to $n^{th}$ SOC ranges defined by the SOC list of interest, based on the current SOC and the first to $n^{th}$ set capacities. The control unit may be configured to determine the remaining charging time, based on the detected current, the first to $n^{th}$ target capacities and the first to $n^{th}$ allowable constant currents defined by the current list of interest.

The control unit may be configured to determine first to $n^{th}$ range estimated times required to charge the battery in each of the first to $n^{th}$ SOC ranges, using the following Equation 1:

$$\Delta T_r[j] = \frac{\Delta Q_{tg}[j]}{\text{MIN}(I_m, I[j])} \quad <\text{Equation 1}>$$

In Equation 1, j denotes a natural number of n or smaller, $I_m$ denotes the detected current, $I[j]$ denotes the $j^{th}$ allowable constant current, $\text{MIN}(I_m, I[j])$ denotes a smaller one of $I_m$ and $I[j]$, $\Delta Q_{tg}[j]$ denotes the $j^{th}$ target capacity, and $\Delta T_r[j]$ denotes the $j^{th}$ range estimated time.

The control unit may be configured to determine the remaining charging time to be equal to a sum of the first to $n^{th}$ range estimated times.

The control unit may be configured to determine first to $n^{th}$ range spent times spent in charging in each of the first to $n^{th}$ SOC ranges while the battery is being charged to the target SOC according to a target charging sequence corresponding to the SOC list of interest and the current list of interest.

The control unit may be configured to determine first to $n^{th}$ capacity losses corresponding to the first to $n^{th}$ SOC ranges in a one-to-one relationship, based on the first to $n^{th}$ range estimated times and the first to $n^{th}$ range spent times.

The control unit may be configured to update the SOC list of interest based on the first to $n^{th}$ capacity losses.

The control unit may be configured to determine the first to $n^{th}$ capacity losses using the following Equation 2:

$$\Delta Q_{loss}[j] = (\Delta T_r[j] - \Delta T_s[j]) \times \text{MIN}(I_m, I[j]) \quad <\text{Equation 2}>$$

In Equation 2, $\Delta T_s[j]$ denotes the $j^{th}$ range spent time, and $\Delta Q_{loss}[j]$ denotes the $j^{th}$ capacity loss.

The control unit may be configured to update the SOC list of interest using the following Equation 3:

$$SOC_{limit}[j] = \frac{1}{Q_{max}} \times \sum_{k=1}^{j}(\Delta Q_{set}[k] - \Delta Q_{loss}[k]) \times 100\% \quad <\text{Equation 3}>$$

In Equation 3, $\Delta Q_{set}[k]$ denotes the $k^{th}$ set capacity, $Q_{max}$ denotes a predetermined maximum capacity, and $SOC_{limit}[j]$ denotes an upper limit of the $j^{th}$ SOC range defined by the updated SOC list of interest.

A battery pack according to another aspect of the present disclosure includes the battery management apparatus.

An electric vehicle according to still another aspect of the present disclosure includes the battery pack.

A battery management method according to yet another aspect of the present disclosure uses the battery management apparatus. The battery management method includes detecting, by the sensing unit, a voltage, a current and a temperature of the battery, determining, by the control unit, a SOC of the battery based on the detected voltage and the detected current, determining, by the control unit, the temperature range of interest, the SOC list of interest and the current list of interest from the charging sequence table, and determining, by the control unit, the remaining charging time based on the detected current, the current SOC, the SOC list of interest and the current list of interest.

Advantageous Effects

According to at least one of the embodiments of the present disclosure, it is possible to accurately estimate the remaining charging time required to charge a battery to a target state of charge (SOC) using a plurality of charging ranges defining allowable constant currents of different magnitudes.

In addition, according to at least one of the embodiments of the present disclosure, it is possible to prevent the accuracy of estimation of the remaining charging time from decreasing due to degradation of the battery by correcting the range of each charging range based on a difference between the estimated time required to charge in each charging range and the actual time spent in charging in each charging range.

The effects of the present disclosure are not limited to the above-mentioned effects, and other effects not mentioned herein will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and may be implemented by either hardware or software or a combination of hardware and software.

In addition, throughout the specification, it will be further understood that when an element is referred to as being "connected to" another element, it can be directly connected to the other element or intervening elements may be present.

Figure 1:
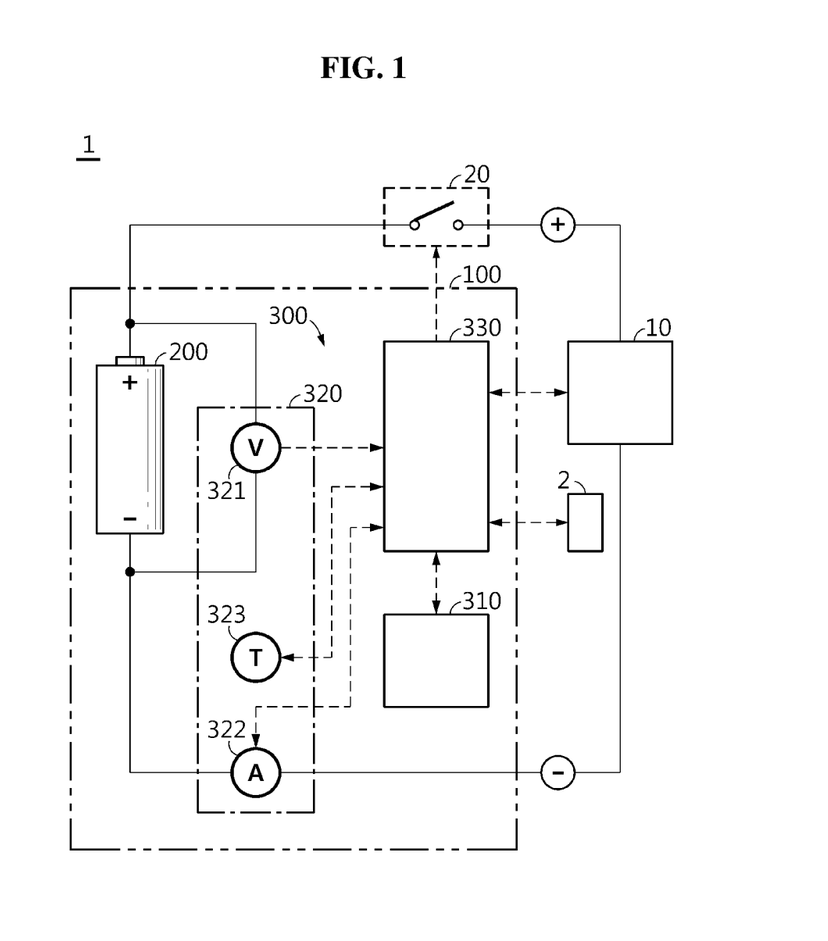
FIG. 1 is a diagram exemplarily showing a configuration of an electric vehicle according to the present disclosure.

FIG. 1 is a diagram exemplarily showing a configuration of an electric vehicle 1 according to the present disclosure.

Referring to FIG. 1, the electrical vehicle 1 includes a battery pack 100, a switch 20 and a charger 10.

The battery pack 100 includes a battery 200 and a battery management system 300.

The battery 200 includes at least one battery cell. When the battery 200 includes a plurality of battery cells, each of the battery cells may be electrically connected to the other battery cells in series and/or in parallel. The battery cell is not limited to a particular type, and may include any type that can be repeatedly recharged, for example, a lithium ion secondary battery.

The switch 20 is installed on a current path connecting between the battery 200 and the charger 10. That is, the battery 200 and the charger 10 are electrically connected to each other through the switch 20. The switch 20 may include a known switching device that can be controlled using an electrical signal such as, for example, a Metal Oxide Semiconductor Field Effect transistor (MOSFET) and a relay, etc.

The charger 10 is configured to supply the battery 200 with a constant current or a constant voltage having magnitude corresponding to a request from the battery management system 300 in response to the request.

The battery management system 300 includes a memory 310, a sensing unit 320 and a control unit 330.

The memory 310 stores programs and various types of data necessary to manage the battery 200. The memory 310 may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) and programmable read-only memory (PROM).

Figure 3:
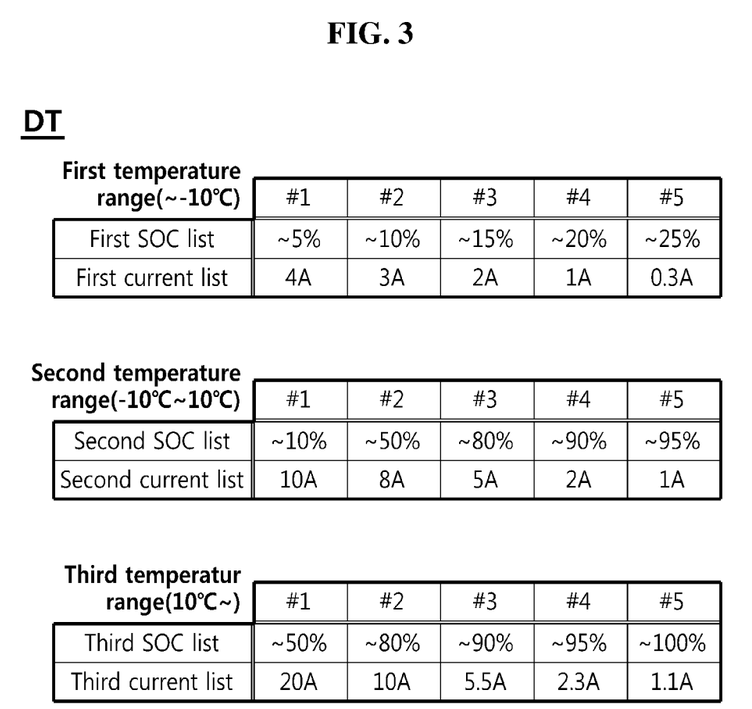
FIG. 3 is a diagram showing an exemplary charging sequence table used to perform the battery management method of FIG. 2.

In particular, the memory 310 may store a charging sequence table DT (see FIG. 3).

The charging sequence table DT records the correspondence relationship between first to $m^{th}$ temperature ranges, first to $m^{th}$ SOC lists and first to $m^{th}$ current lists. m is a natural number of 2 or greater. When i=1 to m, the $i^{th}$ temperature range, the it SOC list and the it current list may be associated with one another.

Each SOC list defines first to nt SOC ranges. Each current list defines first to $n^{th}$ allowable constant currents. n is a natural number of 2 or greater. When j=1 to n, the $j^{th}$ SOC range and the $j^{th}$ allowable constant current may be associated with each other.

In the first to $m^{th}$ SOC lists, the upper limit of the $n^{th}$ SOC range of the SOC list associated with a lower temperature range is lower than the upper limit of the $n^{th}$ SOC range of the SOC list associated with a higher temperature range. For example, as shown in FIG. 3, the upper limit 25% of the fifth SOC range of the first SOC list associated with the first temperature range is lower than the upper limit 100% of the fifth SOC range of the second SOC list associated with the second temperature range that is higher than the first temperature range. This takes into account the characteristics that the electrochemical reaction of the battery 200 slows down in the low temperature environment.

In each current list, the allowable constant current associated with a higher SOC range is lower than the allowable constant current associated with a lower SOC range. Each allowable constant current is preset to suppress the factors (for example, lithium deposition, over-potential, etc.) that degrade the battery 200 due to the charging current.

The charging sequence table DT will be described in more detail with reference to FIG. 3.

The sensing unit 320 is provided to be electrically connected to the battery 200. The sensing unit 320 includes a voltage sensor 321, a current sensor 322 and a temperature sensor 323.

The voltage sensor 321 is electrically connected to positive and negative electrode terminals of the battery 200. The voltage sensor 321 is configured to detect the voltage across the battery 200, and output a voltage signal indicating the detected voltage to a control circuit. The current sensor 322 may be connected in series to the switch 20 between the battery 200 and the charger 10. The current sensor 322 is configured to detect the current flowing through the battery 200, and output a current signal indicating the detected current to the control unit 330. The temperature sensor 323 is configured to detect the temperature of the battery 200, and output a temperature signal indicating the detected temperature to the control unit 330.

The control unit 330 is operably coupled to the charger 10, the switch 20, the memory 310 and the sensing unit 320. The control unit 330 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions.

The control unit 330 is configured to convert each signal from the sensing unit 320 to a digital signal using an embedded Analog to Digital Converter (ADC) and periodically determine battery information indicating the state of the battery 200. The battery information includes at least one of a voltage history, a current history or a temperature history for the last predetermined period of time. The battery information may further include a State Of Charge (SOC) of the battery 200. The SOC is the parameter indicating a ratio of the remaining capacity of the battery 200 to the maximum capacity of the battery 200, and may be expressed as 0 to 1 or 0 to 100%. The maximum capacity indicates the maximum amount of charges that can be stored in the battery 200. The maximum capacity of the battery 200 at the beginning of life may be referred to as design capacity.

The control unit 330 may determine the SOC of the battery 200 based on at least two of the voltage signal, the current signal and the temperature signal collected at a predetermined time interval (for example, 0.001 sec). A variety of known estimation techniques may be used to determine the SOC. For example, using a SOC-Open Circuit Voltage (OCV) table defining the correspondence relationship between the SOC and the OCV, the SOC of the battery 200 may be determined from the OCV of the battery 200 detected by the sensing unit 320. Different estimation techniques such as ampere counting involving periodically integrating the battery current, an equivalent circuit model or an extended Kalman filter may be used to determine the SOC.

The control unit 330 may control the charge of the battery 200 using the charger 10 based on the battery information. The control unit 330 controls the switch 20 into the ON state while the battery 200 is being charged.

Figure 2:
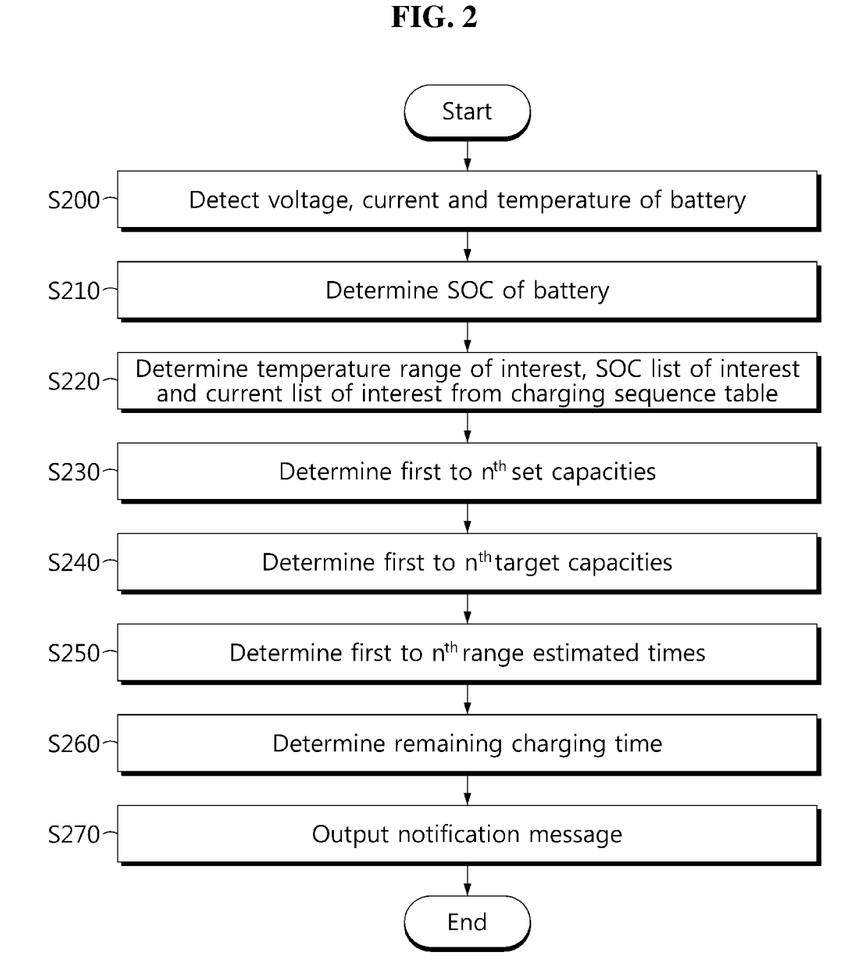
FIG. 2 is a flowchart exemplarily showing a battery management method according to a first embodiment of the present disclosure.

FIG. 2 is a flowchart exemplarily showing a battery management method according to a first embodiment of the present disclosure, and FIG. 3 is a diagram showing an exemplary charging sequence table used to perform the battery management method of FIG. 2.

The battery management method of FIG. 2 is performed by the battery management system 300 to determine the remaining charging time that is the time required to charge the battery 200 from the current SOC to a target SOC.

Referring to FIGS. 1 to 3, in step S200, the control unit 330 detects a voltage, a current and a temperature of the battery 200 using the sensing unit 320. Specifically, when the sensing unit 320 outputs a voltage signal, a current signal and a temperature signal to the control unit 330, the control unit 330 generates battery information indicating the voltage, the current and the temperature of the battery 200 based on each signal.

In step S210, the control unit 330 determines the current SOC of the battery 200 based on each signal from the sensing unit 320.

In step S220, the control unit 330 determines a temperature range of interest, a SOC list of interest and a current list of interest from the charging sequence table DT based on the detected temperature.

FIG. 3 shows the table DT where m=3, n=5. Referring to FIG. 3, temperatures equal to or lower than −10° C. are defined as the first temperature range, temperatures between −10° C. and 10° C. are defined as the second temperature range, and temperatures equal to or higher than 10° C. are defined as the third temperature range. The first SOC list defines 0 to 5% SOCs as the first SOC range, 5 to 10% SOCs as the second SOC range, 10 to 15% SOCs as the third SOC range, and 15 to 20% SOCs as the fourth SOC range, and 20 to 25% SOCs as the fifth SOC range. The second SOC list defines 0 to 10% SOCs as the first SOC range, 10 to 50% SOCs as the second SOC range, 50 to 80% SOCs as the third SOC range, and 80 to 90% SOCs as the fourth SOC range, and 90 to 95% SOCs as the fifth SOC range. The third SOC list defines 0 to 50% SOCs as the first SOC range, 50 to 80% SOCs as the second SOC range, 80 to 90% SOCs as the third SOC range, and 90 to 95% SOCs as the fourth SOC range, and 95 to 100% SOCs as the fifth SOC range. The first current list defines 4 A (ampere) as the first allowable constant current, 3 A as the second allowable constant current, 2 A as the third allowable constant current, 1 A as the fourth allowable constant current, and 0.3 A as the fifth allowable constant current. The second current list defines 10 A as the first allowable constant current, 8 A as the second allowable constant current, 5 A as the third allowable constant current, 2 A as the fourth allowable constant current, and 1 A as the fifth allowable constant current. The third current list defines 20 A as the first allowable constant current, 10 A as the second allowable constant current, 5.5 A as the third allowable constant current, 2.3 A as the fourth allowable constant current, and 1.1 A as the fifth allowable constant current.

The temperature range of interest is any one of the first to $n^{th}$ temperature ranges, to which the temperature detected in the step S200 belongs. For example, when the temperature detected in the step S200 is 0° C., since 0° C. belongs to the second temperature range, the control unit 330 determines the second temperature range as the temperature range of interest. In addition, the control unit 330 may determine the second SOC list and the second current list associated with the temperature range of interest (−10° C. to 10° C.) as the SOC list of interest and the current list of interest respectively. The target SOC may be the upper limit of the nt SOC range defined by the SOC list of interest. For example, when the second current list is determined as the SOC list of interest, the control unit 330 may determine the target SOC to be equal to the upper limit (95%) of the fifth SOC range defined by the second current list.

In step S230, the control unit 330 determines first to $n^{th}$ set capacities. The first to $n^{th}$ set capacities correspond to the first to $n^{th}$ SOC ranges defined by the SOC list of interest in a one-to-one relationship. When j=1 to n, the $j^{th}$ set capacity is capacity corresponding to a difference between the lower limit and the upper limit of the $j^{th}$ SOC range defined by the SOC list of interest. For example, as the lower limit and the upper limit of the second SOC range defined by the second SOC list are 10% and 50% respectively, the second set capacity may be equal to 40% of the maximum capacity. For reference, the upper limit of the $j^{h}$ SOC range may be equal to the lower limit of the $j+1^{th}$ SOC range.

Assume that the second SOC list is the SOC list of interest, and the maximum capacity of the battery 200 is 10 Ah (ampere-hour). The first set capacity is determined as 1 Ah, the second set capacity as 4 Ah, the third set capacity as 3 Ah, the fourth set capacity as 1 Ah, and the fifth set capacity as 0.5 Ah.

In step S240, the control unit 330 determines first to $n^{th}$ target capacities. The first to $n^{th}$ target capacities also correspond to the first to $n^{th}$ SOC ranges defined by the SOC list of interest in a one-to-one relationship. When j=1 to n, the $j^{th}$ target capacity is the total capacity required to charge the battery 200 in the $j^{th}$ SOC range defined by the SOC list of interest.

Assume that the second SOC list is the SOC list of interest, the maximum capacity of the battery 200 is 10 Ah, and the current SOC determined in the step S210 is 30%. In this case, as the current SOC 30% belongs to the second SOC range 10 to 50% beyond the first SOC range 0 to 10% of the second SOC list, the first target capacity is determined as 0 Ah. In addition, as it is necessary to charge the capacity corresponding to 20% of the maximum capacity to reach the upper limit 50% of the second SOC range, the second target capacity is determined as 2 Ah. As the lower limit of the third to fifth SOC ranges is higher than 30%, the third to fifth target capacities are determined to be equal to the third to fifth set capacities respectively.

In step S250, the control unit 330 determines first to $n^{th}$ range estimated times. The first to $n^{th}$ range estimated times are based on the current detected in the step S200, the first to $n^{th}$ target capacities and the first to $n^{th}$ allowable constant currents defined by the current list of interest. When j=1 to n, the $j^{th}$ range estimated time is an estimated time required to charge the battery 200 in the $j^{th}$ SOC range. The control unit 330 may determine the first to $n^{th}$ range estimated times using the following Equation 1.

$$\Delta T_r[j] = \frac{\Delta Q_{tg}[j]}{\text{MIN}(I_m, I[j])} \quad <\text{Equation 1}>$$

In Equation 1, $I_m$ denotes the current detected in the step S200, I[j] denotes the $j^{th}$ allowable constant current of the current list of interest, $\Delta Q_{tg}[j]$ denotes the $j^{th}$ target capacity, and $\Delta T_r[j]$ denotes the $j^{th}$ range estimated time. MIN(x, y) is a function that outputs a smaller one of x and y. MIN(z, z)=z.

Assume that $I_m$=8 A. By Equation 1, the first range estimated time will be determined as 0 Ah/8 A=0 h (hour), the second range estimated time as 2 Ah/8 A=0.25 h, the third range estimated time as 3 Ah/5 A=0.375 h, the fourth range estimated time as 1 Ah/2 A=0.5 h, and the fifth range estimated time as 0.5 Ah/1 A=0.5 h.

In step S260, the control unit 330 determines the remaining charging time. The remaining charging time equals the sum of the first to $n^{th}$ range estimated times. For example, the remaining charging time=(0+0.25+0.375+0.5+0.5) h=1.625 h.

In step S270, the control unit 330 outputs a notification message indicating the remaining charging time. The notification message may be transmitted to the charger 10 and/or a high-level controller 2 coupled to the control unit 330 via a wired or wireless communication channel. The high-level controller 2 may be an electronic control unit (ECU) of an electric vehicle 1. The communication channel may use, for example, the wired communication protocol such as Controller Area Network (CAN) or the wireless communication protocol such as ZigBee or Bluetooth.

On the other hand, independently from the operation of determining the remaining charging time, the control unit 330 may control the charge of the battery 200 until the SOC of the battery 200 reaches the target SOC, according to the target charging sequence corresponding to each of the SOC list of interest and the current list of interest determined in the step S220.

Figure 4:
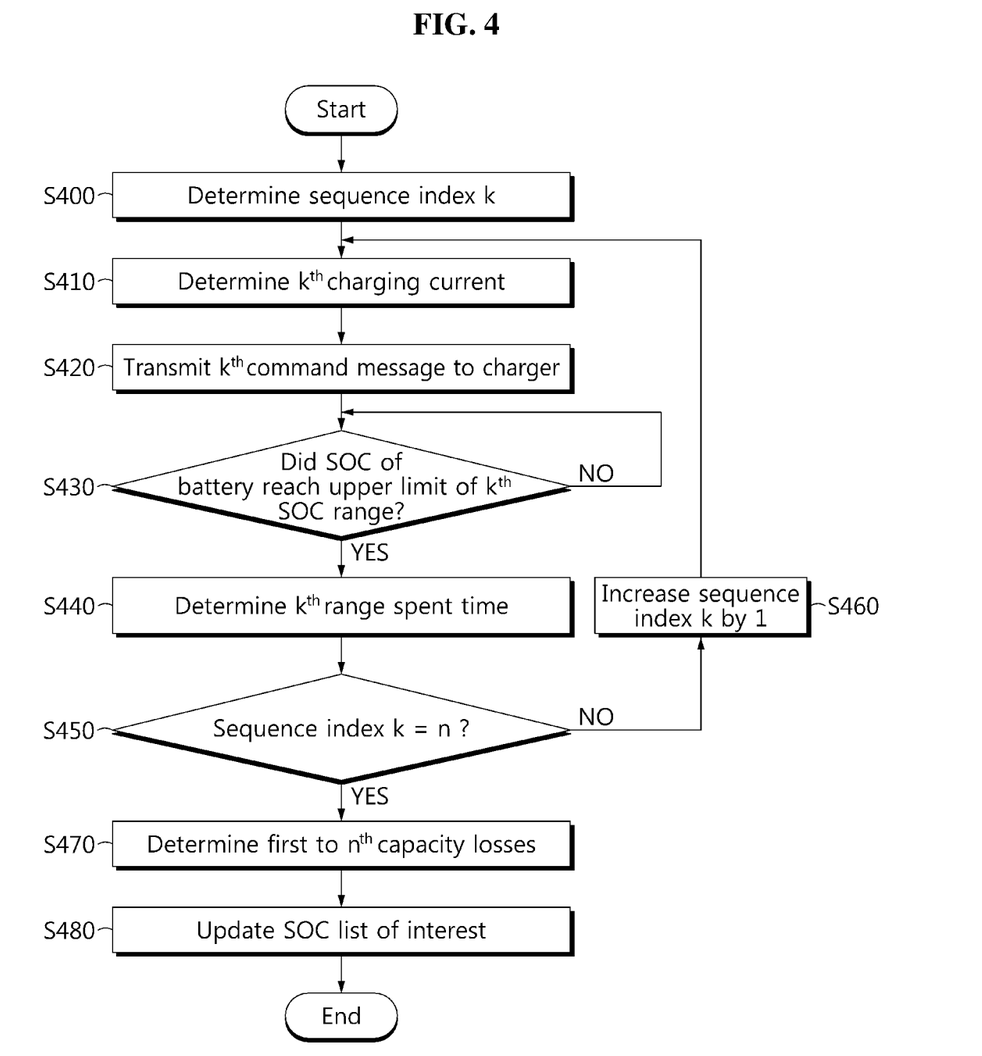
FIG. 4 is a flowchart exemplarily showing a battery management method according to a second embodiment of the present disclosure.
Figure 5:
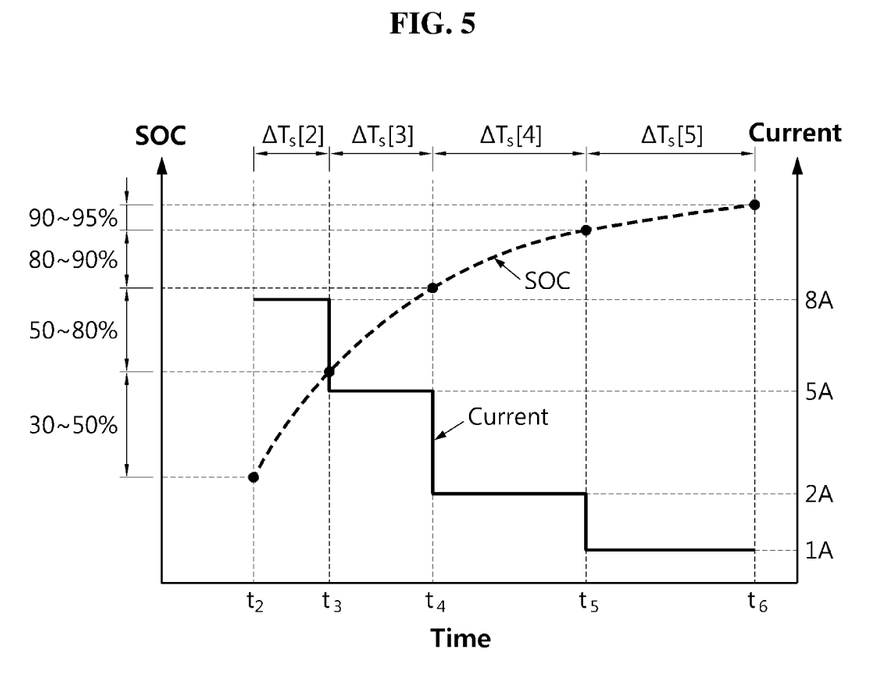
FIG. 5 is a diagram for reference in describing an exemplary charging procedure by the battery management method of FIG. 4.

FIG. 4 is a flowchart exemplarily showing a battery management method according to a second embodiment of the present disclosure, and FIG. 5 is a diagram for reference in describing an exemplary charging procedure by the battery management method of FIG. 4.

The battery management method of FIG. 4 is for charging the battery 200 according to the target charging sequence and updating the SOC list of interest used to determine the remaining charging time in the battery management method of FIG. 2. The battery management method of FIG. 4 may be performed after the step S220.

Referring to FIGS. 1 to 4, in step S400, the control unit 330 determines a sequence index k based on the current SOC of the battery 200. Where j=1 to n, when the current SOC of the battery 200 belongs to the $j^{th}$ SOC range of the SOC list of interest, the sequence index k may be determined to be equal to j. For example, when the SOC of the battery 200 is 30%, 30% belongs to the second SOC range of the SOC list of interest, and thus k=2.

In step S410, the control unit 330 determines the $k^{th}$ charging current. The $k^{th}$ charging current is a smaller one of the current detected in the step S200 and the $k^{th}$ allowable constant current defined by the current list of interest. For example, when the sequence index k=2, the current 8 A detected in the step S200 and the second allowable constant current 8 A are equal, and thus 8 A is determined as the second charging current. In another example, when the sequence index k=3, a smaller one (5 A) of the current 8 A detected in the step S200 and the third allowable constant current 5 A is determined as the third charging current.

In step S420, the control unit 330 transmits to the charger 10 a $k^{th}$ command message requesting the supply of the kl charging current to the battery 200. The charger 10 is configured to supply the kl charging current to the battery 200 in response to the kl command message.

In step S430, the control unit 330 determines whether the SOC of the battery 200 reached the upper limit of the kl SOC range of the SOC list of interest. A value of the step S430 being "YES" indicates that the charging procedure in the kl SOC range has been completed. When the value of the step S430 is "YES", step S440 is performed. When the value of the step S430 is "NO", step S430 may be performed again.

In step S440, the control unit 330 determines the $k^{th}$ range spent time. The $k^{th}$ range spent time is the time spent in charging the battery 200 in the $k^{th}$ SOC range. For example, the $k^{th}$ range spent time may be determined to be equal to the period of time from the time when the $k^{th}$ charging current was determined to the time when the SOC of the battery 200 reached the upper limit of the kl SOC range.

In step S450, the control unit 330 determines whether the sequence index k is equal to n. When a value of the step S450 is "NO", step S460 is performed. The value of the step S450 being "YES" indicates that the SOC of the battery 200 reached the target SOC. When the value of the step S450 is "YES", step S470 is performed.

In step S460, the control unit 330 increases the sequence index k by 1. After the step S460, the process may return to the step S410.

In step S470, the control unit 330 determines first to $n^{th}$ capacity losses. When j=1 to n, the $j^{th}$ capacity loss is a difference between the $j^{th}$ target capacity and the increased capacity of the battery 200 for the $k^{th}$ range spent time. That is, as the battery 200 degrades, the $j^{th}$ capacity loss may increase, and thus the $j^{th}$ capacity loss may indicate a decrease in the total capacity required to charge the $j^h$ SOC range. The control unit 330 may determine the first to $n^{th}$ capacity losses using the following Equation 2.

$$\Delta Q_{loss}[j] = (\Delta T_r[j] - \Delta T_s[j]) \times \text{MIN}(I_m, I[j]) \quad <\text{Equation 2}>$$

In Equation 2, $\Delta T_r[j]$ denotes the $j^{th}$ range estimated time, $\Delta T_s[j]$ denotes the $j^{th}$ range spent time, and $\Delta Q_{loss}[j]$ denotes the $j^{th}$ capacity loss. Equation 2 may be expressed as the following Equation 2-1.

$$\Delta Q_{loss}[j] = \quad <\text{Equation 2-1}>$$
$$\Delta Q_{tg}[j] - \Delta T_s[j] \times \text{MIN}(I_m, I[j]) = \Delta Q_{tg}[j] - \Delta Q_{ch}[j]$$

In Equation 2-1, $\Delta Q_{ch}[j]$ denotes the increased capacity of the battery 200 for the $k^{th}$ range spent time.

In step S480, the control unit 330 updates the SOC list of interest. The control unit 330 may update the SOC list of interest recorded in the charging sequence table DT using the following Equation 3.

$$SOC_{limit}[j] = \frac{1}{Q_{max}} \times \sum_{k=1}^{j} (\Delta Q_{set}[k] - \Delta Q_{loss}[k]) \times 100\% \quad <\text{Equation 3}>$$

In Equation 3, $\Delta Q_{set}[k]$ denotes the kl set capacity, $Q_{max}$ denotes the maximum capacity, $SOC_{limit}[j]$ denotes the upper limit of the $j^{th}$ SOC range defined by the updated SOC list of interest.

The graph shown in FIG. 5 shows the process of charging the battery 200 according to the target charging sequence when the current detected in the step S200 is 8 A, SOC=30% determined in the step S210, and the SOC list of interest and the current list of interest determined in the step S220 are the second SOC list and the second current list of the charging sequence table DT, respectively.

Referring to FIGS. 1 to 5, from the time point $t_2$ from the time point $t_3$, the battery 200 is charged with the second charging current 8 A. The time point $t_3$ is a time point when the SOC of the battery 200 reached the upper limit 50% of the second SOC range. The period of time $\Delta T_s[2]$ from the time point $t_2$ from the time point $t_3$ is determined as the second range spent time spent in charging the second SOC range.

From the time point $t_3$ to the time point $t_4$, the battery 200 is charged with the third charging current 5 A. The time point $t_4$ is a time point when the SOC of the battery 200 reached the upper limit 80% of the third SOC range. The period of time $\Delta T_s[3]$ from the time point $t_3$ from the time point $t_4$ is determined as the third range spent time spent in charging in the third SOC range.

From the time point $t_4$ to the time point $t_5$, the battery 200 is charged with the fourth charging current 2 A. The time point $t_5$ is a time point when the SOC of the battery 200 reached the upper limit 90% of the fourth SOC range. The period of time $\Delta T_s[4]$ from the time point $t_4$ to the time point $t_5$ is determined as the fourth range spent time spent in charging in the four SOC range.

Form the time point $t_5$ to the time point $t_6$, the battery 200 is charged with the fifth charging current 1 A. The time point $t_6$ is a time point when the SOC of the battery 200 reached the target SOC 95% corresponding to the upper limit of the fifth SOC range. The period of time $\Delta T_s[5]$ from the time point $t_5$ to the time point $t_6$ is determined as the fifth range spent time spent in charging in the fifth SOC range. At the time point $t_6$, constant current charging may be shifted to constant voltage charging.

Meanwhile, as the charging in the first SOC range was omitted, the first range spent time is 0 h.

Assume that the first to fifth range estimated times are 0 h, 0.25 h, 0.375 h, 0.5 h, 0.5 h respectively, the first to fifth range spent times are 0 h, 0.1875 h, 0.365 h, 0.375 h, 0.5 h respectively, and the maximum capacity $Q_{max}$ is 10 Ah. By Equation 2 (or Equation 2-1), the first to fifth capacity losses are determined as 0 Ah, 0.5 Ah, 0.05 Ah, 0.25 Ah, 0 Ah respectively. Subsequently, by Equation 3, the SOC list of interest is updated. That is, the upper limit of each of the first to fifth SOC ranges defined by the SOC list of interest is updated from 10%, 50%, 80%, 90%, 95% to 10%, 45%, 74.5%, 82%, 82.5%.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A battery management apparatus, comprising:
a memory to store a charging sequence table that records a correspondence relationship between first to $m^{th}$ temperature ranges, first to $m^{th}$ state of charge (SOC) lists and first to $m^{th}$ current lists, wherein m is a natural number of 2 or greater;
a sensing unit configured to detect a voltage, a current and a temperature of a battery; and
a control unit operably coupled to the memory and the sensing unit,
wherein each of the SOC lists defines first to $n^{th}$ SOC ranges, and n is a natural number of 2 or greater,
each of the current lists defines first to $n^{th}$ allowable constant currents corresponding to the first to $n^{th}$ SOC ranges in a one-to-one relationship, and
the control unit is configured to:
determine a current SOC of the battery based on the detected voltage and the detected current,
determine a temperature range of interest, a SOC list of interest and a current list of interest from the charging sequence table based on the detected temperature, wherein the temperature range of interest is a temperature range to which the detected temperature belongs among the first to $m^{th}$ temperature ranges, the SOC list of interest is a SOC list corresponding to the temperature range of interest among the first to $m^{th}$ SOC lists, and the current list of interest is a current list corresponding to the temperature range of interest among the first to $m^{th}$ current lists, and
determine a remaining charging time required to charge the battery to a target SOC based on the detected current, the current SOC, the SOC list of interest and the current list of interest.

2. The battery management apparatus according to claim 1, wherein the control unit is configured to:
determine first to $n^{th}$ set capacities corresponding to the first to $n^{th}$ SOC ranges defined by the SOC list of interest in a one-to-one relationship,
determine first to $n^{th}$ target capacities for charging the battery in each of the first to $n^{th}$ SOC ranges defined by the SOC list of interest, based on the current SOC and the first to $n^{th}$ set capacities, and
determine the remaining charging time, based on the detected current, the first to $n^{th}$ target capacities and the first to $n^{th}$ allowable constant currents defined by the current list of interest.

3. The battery management apparatus according to claim 2, wherein the control unit is configured to:
determine first to $n^{th}$ range estimated times required to charge the battery in each of the first to $n^{th}$ SOC ranges, using the following Equation 1:

$$\Delta T_r[j] = \frac{\Delta Q_{tg}[j]}{\text{MIN}(I_m, I[j])} \qquad <\text{Equation 1}>$$

wherein in Equation 1, j denotes a natural number of n or smaller, $I_m$ denotes the detected current, $I[j]$ denotes the $j^{th}$ allowable constant current, $\text{MIN}(I_m, I[j])$ denotes a smaller one of $I_m$ and $I[j]$, $\Delta Q_{tg}[i]$ denotes the $j^{th}$ target capacity, and $\Delta T_r[j]$ denotes the $j^{th}$ range estimated time.

4. The battery management apparatus according to claim 3, wherein the control unit is configured to determine the remaining charging time to be equal to a sum of the first to $n^{th}$ range estimated times.

5. The battery management apparatus according to claim 3, wherein the control unit is configured to determine first to $n^{th}$ range spent times spent in charging in each of the first to $n^{th}$ SOC ranges while the battery is being charged to the target SOC according to a target charging sequence corresponding to the SOC list of interest and the current list of interest.

6. The battery management apparatus according to claim 5, wherein the control unit is configured to:
determine first to $n^{th}$ capacity losses corresponding to the first to $n^{th}$ SOC ranges in a one-to-one relationship, based on the first to $n^{th}$ range estimated times and the first to $n^{th}$ range spent times, and
update the SOC list of interest based on the first to $n^{th}$ capacity losses.

7. The battery management apparatus according to claim 6, wherein the control unit is configured to determine the first to $n^{th}$ capacity losses using the following Equation 2:

$$\Delta Q_{loss}[j] = (\Delta T_r[j] - \Delta T_s[j]) \times \text{MIN}(I_m, I[j]) \qquad < \text{Equation 2} >$$

wherein in Equation 2, $\Delta T_s[j]$ denotes the $j^{th}$ range spent time, and $\Delta Q_{loss}[j]$ denotes the $j^{th}$ capacity loss.

8. The battery management apparatus according to claim 7, wherein the control unit is configured to update the SOC list of interest using the following Equation 3:

$$SOC_{limit}[j] = \frac{1}{Q_{max}} \times \sum_{k=1}^{j} (\Delta Q_{set}[k] - \Delta Q_{loss}[k]) \times 100\% \qquad < \text{Equation 3} >$$

wherein in Equation 3, $\Delta Q_{set}[k]$ denotes the $k^{th}$ set capacity, $Q_{max}$ denotes a predetermined maximum capacity, and $SOC_{limit}[j]$ denotes an upper limit of the $j^{th}$ SOC range defined by the updated SOC list of interest.

9. A battery pack comprising the battery management apparatus according to claim 1.

10. An electric vehicle comprising the battery pack according to claim 9.

11. A battery management method performed by the battery management apparatus according to claim 1, the battery management method comprising:
detecting, by the sensing unit, a voltage, a current and a temperature of the battery;
determining, by the control unit, a current state of charge (SOC) of the battery based on the detected voltage and the detected current;
determining, by the control unit, the temperature range of interest, the SOC list of interest and the current list of interest from the charging sequence table; and
determining, by the control unit, the remaining charging time based on the detected current, the current SOC, the SOC list of interest and the current list of interest.

12. The battery management apparatus according to claim 1, wherein determining the remaining charging time required to charge the battery to the target SOC comprises:
determining first to $n^{th}$ range estimated times, each range estimated time corresponding to an estimated time to charge the battery within a respective SOC range of the SOC list of interest, and
calculating the remaining charging time as a sum of the first to $n^{th}$ range estimated times.

13. The battery management apparatus according to claim 12, wherein the first to $n^{th}$ range estimated times are determined based, at least in part, on the detected current and the first to $n^{th}$ constant currents defined by the current list of interest that was selected based on the detected temperature.

14. A battery management method, comprising:
storing a charging sequence table that records a correspondence relationship between first to $m^{th}$ temperature ranges, first to $m^{th}$ state of charge (SOC) lists and first to $m^{th}$ current lists, wherein m is a natural number of 2 or greater, wherein each of the SOC lists defines first to $n^{th}$ SOC ranges, and n is a natural number of 2 or greater, and each of the current lists defines first to $n^{th}$ allowable constant currents corresponding to the first to $n^{th}$ SOC ranges in a one-to-one relationship;
detecting a voltage, a current, and a temperature of a battery;
determining a current SOC of the battery based on the detected voltage and the detected current;
determining a temperature range of interest, a SOC list of interest, and a current list of interest from the charging sequence table based on the detected temperature, wherein the temperature range of interest is a temperature range to which the detected temperature belongs among the first to $m^{th}$ temperature ranges, the SOC list of interest is a SOC list corresponding to the temperature range of interest among the first to $m^{th}$ SOC lists, and the current list of interest is a current list corresponding to the temperature range of interest among the first to $m^{th}$ current lists; and
determining a remaining charging time required to charge the battery to a target SOC based, at least in part, on the detected current, the current SOC, the SOC list of interest, and the current list of interest.

* * * * *